(12) United States Patent
Patzer et al.

(10) Patent No.: US 9,177,871 B2
(45) Date of Patent: Nov. 3, 2015

(54) BALANCING ASYMMETRIC SPACERS

(71) Applicant: GLOBALFOUNDRIES Inc., Grand Cayman (KY)

(72) Inventors: Joachim Patzer, Langebrueck (DE); Peter Baars, Dresden (DE); Bastian Haussdoerfer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 20 days.

(21) Appl. No.: 14/143,362

(22) Filed: Dec. 30, 2013

(65) Prior Publication Data

US 2015/0187660 A1   Jul. 2, 2015

(51) Int. Cl.
| | |
|---|---|
| *H01L 21/8238* | (2006.01) |
| *H01L 21/285* | (2006.01) |
| *H01L 21/265* | (2006.01) |
| *H01L 21/311* | (2006.01) |

(52) U.S. Cl.
CPC .... *H01L 21/823864* (2013.01); *H01L 21/2652* (2013.01); *H01L 21/28518* (2013.01); *H01L 21/31144* (2013.01)

(58) Field of Classification Search
CPC .................................................. H01L 27/1203
USPC ................................ 257/204, 274, 300–360, 257/E27.062–E27.067, E27.108
See application file for complete search history.

(56) References Cited

U.S. PATENT DOCUMENTS

| | | | |
|---|---|---|---|
| 2012/0049284 A1* | 3/2012 | Doris et al. | 257/350 |
| 2012/0187459 A1* | 7/2012 | Pan et al. | 257/288 |
| 2013/0015525 A1* | 1/2013 | Cheng et al. | 257/351 |

* cited by examiner

*Primary Examiner* — Mamadou Diallo
(74) *Attorney, Agent, or Firm* — Amerson Law Firm, PLLC

(57) ABSTRACT

An issue arises when manufacturing semiconductor circuits including PFETs with an SiGe alloy embedded in their source/drain regions and NFETs without any embedded SiGe alloy. In this case, the thickness of the NFET spacers is considerably greater than that of the PFET spacers. In order to alleviate this asymmetry in spacer thickness, a manufacturing flow is proposed wherein a spacer-reducing etching process is introduced before the salicidation. The etching process is performed directly after the ion implantation performed in order to form deep regions of source/drain regions of the NFETs. Thus, the spacer-reducing etching process may be performed in the presence of the same mask used during the NFET deep implantations. The spacer-reducing etching process results in thinning of the NFET spacer structures, thus alleviating the spacer thickness imbalance between NFETs and PFETs.

21 Claims, 10 Drawing Sheets

BALANCING ASYMMETRIC SPACERS

BACKGROUND OF THE INVENTION

1. Field of the Invention

Generally, the present disclosure relates to integrated circuits, and, more particularly, to transistors comprising a gate with a spacer structure formed on its sidewalls. Yet more in particular, the present disclosure relates to an integrated circuit wherein at least two transistors are present having spacer structures with different thicknesses. This situation normally occurs when one of the transistors is an N-channel transistor and the other transistor is a P-channel transistor with a silicon/germanium (SiGe) alloy embedded in the source/drain regions and overfilling the trenches in which it is embedded.

2. Description of the Related Art

Transistors are the dominant components in modern electronic devices. Currently, several hundred millions of transistors may be provided in presently available complex integrated circuits such as microprocessors, CPUs, storage chips and the like. It is then crucial that the typical dimensions of the transistors included in an integrated circuit have as small as possible typical dimensions, so as to enable a high integration density.

One of the most widespread technologies is the complementary metal-oxide-semiconductor (CMOS) technology, wherein complementary field effect transistors (FETs), i.e., P-channel FETs (PFETs) and N-channel FETs (NFETs), are used for forming circuit elements, such as inverters and other logic gates to design highly complex circuit assemblies.

Transistors are usually formed in active regions defined within a semiconductor layer supported by a substrate. Active regions are to be understood as a portion of the semiconductor layer within which and on top of which a transistor or a semiconductor device may be formed. Presently, the semiconductor layer in which most integrated circuits are formed is made out of silicon, which may be provided in crystalline, polycrystalline or amorphous form. Other materials, such as, for example, dopant atoms or ions, may be introduced into the original semiconductor layer.

A MOS transistor, or generally a FET, irrespective of whether an NFET or a PFET is considered, comprises a source and a drain region, highly doped with dopants of the same species. An inversely or weakly doped channel region is then arranged between the drain and the source regions. The conductivity of the channel region, i.e., the drive current capability of the conductive channel, may be controlled by a gate electrode formed in the vicinity of the channel region and separated therefrom by a thin insulating layer. The conductivity of the channel region depends on, among other things, the mobility of the charge carriers and the distance along the transistor width direction between the source and drain regions, which is also referred to as channel length. For example, by reducing the channel length, the channel resistivity decreases. Thus, an increased switching speed and higher drive current capabilities of a transistor may be achieved by decreasing the transistor channel length.

However, reduction of transistor channel length may not be pushed to extreme limits without incurring other problems. For example, the capacitance between the gate electrode and the channel decreases with decreasing channel length. This effect must then be compensated for by reducing the thickness of the insulating layer between the gate and the channel. Extremely small thicknesses of the insulating layer might, however, result in increased leakage currents caused by hot carrier injection and direct tunneling of charge carriers through the extremely thin gate dielectric material. Since a further reduction in thickness of silicon dioxide-based gate dielectric materials may increasingly become incompatible with thermal power requirements of sophisticated integrated circuits, other alternatives have been developed in order to increase the charge carrier mobility in the channel region, thereby also enhancing overall performance of field effect transistors.

When fabricating transistors with typical gate dimensions below 50 nm, a so-called "high-k/metal gate" (HKMG) technology is well known and frequently employed. According to the HKMG manufacturing process flow, the insulating layer included in the gate electrode is comprised of a high-k material. On the other hand, it is also well established to use an oxide/polysilicon (poly/SiON) method, whereby the gate electrode insulating layer is typically comprised of an oxide, preferably silicon dioxide or silicon oxynitride in the case of silicon-based devices.

Currently, two different approaches exist for implementing HKMG in the semiconductor fabrication process flow. In the first approach, called gate-first, the fabrication process flow is similar to that followed during the traditional poly/SiON method. Formation of the gate electrode, including the high-k dielectric film and the work function metal film, is initially performed, followed by the subsequent stages of transistor fabrication, e.g., definition of source and drain regions, silicidation of portions of the substrate surface, metallization, etc. On the other hand, according to the second scheme, also known as gate-last or replacement gate, fabrication stages such as dopant ion implantation, source and drain region formation and substrate silicidation are performed in the presence of a sacrificial dummy gate. The dummy gate is replaced by the real gate after the high-temperature source/drain formation and all silicide annealing cycles have been carried out.

HKMG enables increasing the thickness of the insulation layer in the gate electrode, thereby significantly reducing leakage currents through the gate, even at transistor channel typical sizes as low as 30 nm or smaller. However, implementation of HKMG brings about new technological challenges. For example, new materials have to be found in order to tune the work function of gate electrode species, so as to adjust the transistor threshold voltage to a desired level. Thus, in the HKMG technology, a thin metal layer is inserted between the high-k dielectric and the gate material placed above the high-k dielectric. The threshold voltage can thus be adjusted by varying the thickness of the metal layer. The gate metal layer may comprise, for example, tantalum (Ta), tungsten (W), titanium nitride (TiN) or tantalum nitride (TaN). A work function metal, such as aluminum (Al) or lanthanum (La), may be present in a predetermined percentage in the metal layer or may form a separate layer between the metal layer and the high-k dielectric.

One promising strategy for improving speed and performance of a FET consists in the generation of a certain type of strain in the FET channel region, since the charge carrier mobility in silicon strongly depends on the strain conditions of the crystalline material. For example, it has been found that, for a standard crystallographic configuration of the silicon-based channel region, a compressive strain component in a P-channel transistor may result in a superior mobility of holes, thereby increasing switching speed and drive current of P-channel transistors.

Therefore, attempts have been made in the past decades to improve transistor performance by introducing a stress-inducing material in or near the channel region of silicon-based transistors. Stress can be brought about by the difference in lattice constant between the stress-inducing material and silicon. For instance, in order to induce a compressive stress in the channel region of a P-channel transistor, a material with a slightly larger lattice constant than silicon, such as a silicon/germanium (SiGe) semiconductor alloy, may be epitaxially grown in the transistor active region next to or on top of the channel region.

Thus, trenches may be formed in portions of the source and drain regions of a FET adjacent to the channel region. An SiGe alloy, or a semiconductor alloy in general, may subsequently be epitaxially grown in the trenches. This semiconductor alloy is also commonly referred to as an "embedded semiconductor alloy" or, in the particular case of an SiGe alloy, "embedded SiGe". The embedded semiconductor alloy is then included in the source or drain region of the FET.

According to the gate-first HKMG approach, the gate structure is formed by depositing a stack of layers, which is subsequently appropriately patterned so as to obtain a gate structure of the desired size and dimensions. The gate-first HKMG approach requires the gate electrode stack to withstand the high temperatures reached during the annealing steps performed in order to, e.g., activate the dopant species implanted in the source and drain regions or induce the silicidation process.

Thus, in order to protect the sensitive gate materials during the subsequent fabrication stages, the gate stack is encapsulated into a dielectric casing formed on its sidewall. This protective layer, also known as a "spacer" or "spacer structure," besides protecting the sensitive gate materials, is advantageously used as a mask when implanting dopants of a desired type into the semiconductor layer in which the transistor is formed. In this respect, the spacer structure may be formed in subsequent stages so as to have the appropriate shape and thickness during each implantation step.

In particular, a first spacer portion having a first thickness is formed next to the encapsulating portion. This first portion is usually called "spacer-0". A first series of implantations may be performed using the spacer-0 as a mask. This first series may include implantations carried out in order to define halo regions in the transistor channel region and extension regions in the source and drain regions. Subsequently, the spacer structure may be broadened by forming a second portion above the spacer-0 previously formed. This second portion is usually referred to as "spacer-1". A second series of implantations may then be performed in the presence of both spacer-0 and spacer-1, for example in order to define the deep regions of the source and drain regions.

When forming an array of FETs including NFET and PFET structures, according to the HKMG conventional manufacturing flow, but also if the conventional SiON/polysilicon gate structures are used, problems are incurred if embedded SiGe is used in the source/drain area of PFETs. In both of these cases, spacer structures of different thicknesses are formed on the sidewalls of NFETs and PFETs. This is illustrated in an exemplary manner for an HKMG structure in FIGS. 1a-1e, which show subsequent stages during a conventional HKMG manufacturing flow.

FIG. 1a shows a cross-sectional view of a portion of an integrated circuit 100 in a relatively advanced manufacturing stage. Transistors 151-154 have been partially formed partly in and partly on top of a semiconductor layer 110. Transistors 151-154 are, for example, FETs.

The semiconductor layer 110 is typically supported by a substrate, which may be represented by any suitable carrier for an integrated circuit. The semiconductor layer 110 may comprise, for example, silicon, germanium or also a III-V semiconductor. The semiconductor layer 110 is divided into active zones, which are to be understood as areas of the semiconductor layer 110 in which and upon which one or more FETs may be formed. FIG. 1a shows a first active region 112 housing FETs 151 and 152, and a second active region 114 housing FETs 153 and 154. FETs 151 and 152 may conveniently have an opposite polarity with respect to FETs 153 and 154. For example, FETs 151 and 152 may be N-channel FETS, whereas FETs 153 and 154 may be P-channel FETs.

Active regions 112 and 114 are separated by an isolation region 116, typically comprising an insulating material such as, for example, an oxide. For example, the isolation region 116 may comprise silicon dioxide ($SiO_2$) and may have been formed by means of the shallow trench isolation (STI) technique.

Transistors 151-154 each comprise a respective gate structure 151g-154g. The gate structures 151g-154g shown in FIG. 1a have been formed according to the HKMG technology. Thus, the gate structures 151g-154g are each made up of a stack comprising an insulation layer 161 formed on the surface of the semiconductor layer 110, a gate metal layer 163 and a gate material layer 165.

The insulation layer 161, formed on the surface of active regions 112 or 114, comprises a high-k material. The gate metal layer 163 is formed between the insulation layer 161 and the gate material 165 so as to adjust the transistor threshold voltage. The gate material layer 165, formed directly on the upper surface of the gate metal layer 163, typically comprises a semiconductor such as polysilicon.

Each transistor 151-154 comprises a respective spacer structure 171-174 formed on the sidewall of the respective gate structure 151g-154g. The spacer structures 171-174 comprise a dielectric material which is negligibly affected by the standard wet etching process performed for cleaning purposes on the surface of the integrated circuit. Furthermore, the dielectric material constituting spacer structures 171-174 hinders transport of oxygen or other gases through its thickness. Typically, the spacer structures 171-174 are comprised of silicon nitride ($Si_3N_4$).

In the fabrication stage shown in FIG. 1a, spacer structures 171-174 comprise an inner portion 171sp0-174sp0, respectively, known as spacer-0. The spacer-0 structures 171sp0-174sp0 typically comprise $Si_3N_4$. As further shown in FIG. 1a, the spacer structures 171-174 may conveniently comprise one or more liner layers 167, used as stop-etch layers when forming the spacer structures 171-174. The liner layer 167 typically comprises an oxide. For example, the liner layer 167 may be comprised of silicon dioxide ($SiO_2$).

The spacer structures 171-174 may be formed by depositing a first liner layer 167i, included in liner layers 167, onto the surface of the integrated circuit 100 after forming the gate structures 151g-154g. Thus, the first liner layer 167i is formed adjacent to the gate structures 151g-154g. Subsequently, a dielectric layer, such as an $Si_3N_4$ layer, may be deposited onto the first liner layer 167i and appropriately patterned in order to obtain spacer-0 structures 171sp0-174sp0. Patterning is conveniently achieved by an anisotropic etching selective to the liner layer 167i. The spacer-0 structures 171sp0-174sp0 are, thus, formed adjacent to the gate structures 171g-174g, respectively, and separated therefrom by the first liner layer 167i.

After forming the spacer-0 structures 171sp0-174sp0, a First Series of Implantations may be performed, for example, in order to form halo regions and extension regions (not shown) of transistors 151-154 in the semiconductor layer 110. Subsequently, a second liner layer 167o, also included in liner layer 167, is deposited onto the surface of the integrated circuit 100. Deposition of the second liner layer 167o is then followed by the deposition of a second dielectric layer 173, e.g., an $Si_3N_4$ layer, onto the second liner layer 167o. The dielectric layer 173 is generally deposited by using a highly conformal deposition technique, such as, for example, chemical vapor deposition (CVD). The dielectric layer 173 is subsequently patterned in order to form an outer portion of the spacer structures 171-174 called spacer-1, as will be described in the following.

FIG. 1a shows that semiconductor alloy layers 122-124 are embedded in the second active region 114, next to the gate structures 153g and 154g. The semiconductor alloy layers 122-124 typically comprise embedded SiGe (eSiGe) with a variable Ge concentration. The semiconductor alloy layers 122-124 are obtained by forming trenches in predetermined positions of the active region 114 adjacent to the gate structures 153g and 154g. The trenches are then epitaxially filled with a semiconductor alloy. If FETs 153 and 154 are P-channel FETs, the semiconductor alloy layers 122-124 may be conveniently doped with a P-type doping agent, which may include, for example, boron (B). Doping of the semiconductor alloy layers 122-124 is conveniently performed in situ while epitaxially depositing the semiconductor alloy layers 122-124 in the trenches. Furthermore, if FETs 153 and 154 have a P-channel, the semiconductor alloy in layers 122-124 is typically SiGe. As said above, since SiGe has a larger lattice constant than Si, SiGe layers 122-124 exert a compressive strain onto the areas of the active region 114 directly underneath the gate structures 153g and 154g, which are to be included in the channel regions of FETs 153 and 154, respectively. This is beneficial to the mobility of holes in the channel region of a P-channel FET.

FIG. 1a also shows that, in the case in which semiconductor alloy layers 122-124 comprise SiGe, layers 122-124 each comprise a bottom portion 122a-124a, a middle portion 122b-124b and a top portion 122c-124c. The three portions of the SiGe alloy layers 122-124 differ from each other for the concentration of Ge.

More specifically, bottom portions 122a-124a have a lower Ge concentration than middle portions 122b-124b. For example, the concentration of Ge in bottom portions 122a-124a could be of approximately 25%, whereas the concentration of Ge in middle portions 122b-124b could be of approximately 35%. Thus, bottom portions 122a-124a formed adjacent to the surface of active regions 114 have a smaller lattice constant than middle portions 122b-124b formed above bottom portions 122a-124a, respectively. Since the lattice mismatch with silicon is smaller, bottom portions 122a-124a are affected by a lower degree of internal strain than middle portions 122b-124b, which favors a pseudomorphic epitaxial growth of SiGe layers 122-124 onto the semiconductor layer 110, typically including silicon.

Top portions 122c-124c of SiGe alloy layers 122-124 are then formed above middle portions 122b-124b, respectively. Top portions 122c-124c contain a substantially null concentration of Ge and are exclusively comprised of Si. The presence of top portions 122c-124c is necessary in order to favor the silicidation process subsequently performed on the surface of the integrated circuit 100 in order to form electrical connections to the electrodes of the FETs formed therein. Metal silicide formation is indeed known to be much more easily and reliably achieved in Si than in an SiGe alloy.

The structure of the semiconductor alloy layers 122-124 discussed above results in the trenches being significantly overfilled by the semiconductor alloy material. The semiconductor alloy material of layers 122-124, typically SiGe, can in some cases protrude outwards, for instance, by a height of approximately 15 nm from the plane identified by the surface of the semiconductor layer 110. In general, the semiconductor alloy material of layers 122-124 protrudes typically more than 10 nm, often more than 20 nm from the plane identified by the surface of the semiconductor layer 110.

In FIG. 1b a cross-sectional view is shown of the integrated circuit 100 in a subsequent manufacturing stage to that shown in FIG. 1a. After forming the dielectric layer 173 shown in FIG. 1a, this is patterned in order to give rise to outer portions 171sp1-174sp1 of spacer structures 171-174, respectively, shown in FIG. 1b. Outer portions 171sp1-174sp1 are also known as spacer-1 structures. Patterning is usually achieved by means of a dry etching selective to liner layer 167, in such a way that the second liner layer 167o acts as a stop-etch layer. The dry etching process is preferably highly anisotropic. Patterning of the dielectric layer 173 is usually performed without the presence of a mask, thus affecting the whole surface of the integrated circuit 100.

As shown in FIG. 1b, spacer-1 structures 171sp1-174sp1 have different thicknesses from each other. More specifically, spacer-1 structures 171sp1 and 172sp1 of FETs 151 and 152 are considerably thicker than spacer-1 structures 173sp1 and 174sp1 of FETs 153 and 154. This is due to the fact that the semiconductor alloy material 122-124 overfilling the trenches between and around FETs 153 and 154 causes the thickness of the portion of conformal nitride layer 173 lying above FETs 153 and 154 to decrease with respect to the thickness of the portion of conformal nitride layer 173 lying above FETs 151 and 152.

While FIGS. 1a and 1b show the process flow for an HKMG structure, the skilled person will understand that the same thickness constraints for the spacer-1 structures will result in a SiON/polysilicon gate structure process due to the raised surface portion of the eSiGe in the trench between FETs 153 and 154.

The large thickness of spacer-1 structures 171sp1 and 172sp1 results in a high aspect ratio of the gap between FETs 151 and 152. In general, the aspect ratio of an aperture is defined as the ratio of the length (dimension along the vertical axis in the figures) to the width (dimension along the horizontal axis in the figures) of the aperture.

As a result of the patterning process of conformal nitride layer 173, the distance between spacer-1 structures 171sp1 and 172sp1 shown in FIG. 1b is considerably less than the distance between spacer-1 structures 173sp1 and 174sp1. Therefore, the portion of the surface of the semiconductor layer 110 included between FETs 151 and 152 is much smaller than that included between FETs 153 and 154.

FIG. 1c shows a cross-sectional view of the integrated circuit 100 in a subsequent manufacturing stage to that shown in FIG. 1b. After forming spacer-1 structures 171sp1-174sp1 as described above, a further series of ion implantations may be performed. For example, during this series of implantations, doping agents may be implanted in active region 112 in order to form deep regions (not shown) of source and drain regions of FETs 151 and 152. Thereafter, an annealing step is performed in order to activate the implanted ions and to let the semiconductor layer 110 recover from implantation damage.

After the annealing step, a further etching is performed on the surface of the integrated circuit 100 in order to remove the exposed portion of the oxide liner layer 167, i.e., the portion of the oxide liner layer 167 not lying underneath one of the gate structures 151g-154g or of the spacer structures 171-174. FIG. 1c shows the integrated circuit 100 after this oxide liner removal process. After removing the exposed portion of the oxide liner layer 167, the gate material 165 is exposed in the gate structures 151g-154g. Furthermore, portions of the surfaces of the active regions 112 and 114 are left exposed between and around FETs 151-154. It should be noted that, after the exposed portions of the oxide liner layer 167 have been removed, the aspect ratio of the gap between FETs 151 and 152 is increased.

FIG. 1d shows that a silicidation process 181 is carried out on the integrated circuit 100 after removing the exposed liner layer 167. The silicidation process 181 is carried out in order to decrease the contact resistance to the electrodes of FETs 151-154. Silicidation 181 is performed according to a well-established procedure.

Salicidation (i.e., self-aligned silicidation) 181 is typically performed by depositing a refractory metal layer onto the exposed face of the integrated circuit 100. The refractory metal layer may comprise, for example, a metal such as nickel, titanium, cobalt and the like. Preferably, the refractory metal layer comprises nickel. The refractory metal layer may also comprise platinum, which, in some cases, may promote a more homogeneous formation of nickel monosilicide.

A heat treatment is then applied to the semiconductor structure 100 in order to promote a chemical reaction between the metal atoms of the deposited layer and the silicon atoms of the exposed surface of the semiconductor structure 100.

FIG. 1d shows that, as a result of the heat treatment, metal silicide layers 151gs-154gs have formed partly in and partly on top of the gate material 165 of the gate structures of FETs 151-154. Furthermore, metal silicide layers 140 and 141 have formed partly in and partly on top of the first active region 112, so as to provide electrical contacts with a low contact resistance to the source and drain regions of transistors 151 and 152. Analogously, metal silicide layers 142-144 have formed partly in and partly on top of the semiconductor alloy layers 122-124, respectively, so as to provide electrical contacts with a low contact resistance to the source and drain regions of transistors 153 and 154. More specifically, metal silicide layers 142-144 have formed in top portions 122c-124c of the semiconductor alloy layers 122-124, respectively. Typically, metal silicide layers 151gs-154gs and 140-144 comprise nickel silicide.

Due to the proximity of spacer-1 structure 171sp1 to spacer-1 structure 172sp1, metal silicide layer 140 formed between FETs 151 and 152 is much smaller than metal silicide layer 143 formed between FETs 153 and 154. In particular, the width (dimension along the horizontal direction in FIG. 1d) of metal silicide layer 140 is much less than the width of metal silicide layer 143. This results in a significantly higher contact resistance of metal silicide 140 as compared to metal silicide layer 143. For example, the contact resistance to the source and drain regions of FETs 151 and 152 has been measured to be up to 50% greater than the contact resistance to the source and drain regions of FETs 153 and 154.

After the silicidation process 181, an internally stressed layer (not shown) is normally deposited on the surface of the integrated circuit 100 in order to improve the device performance. The stressed layer is to fill all void spaces and gaps between neighboring FETs 151-154. However, due to the high aspect ratio of the gap between FETs 151 and 152, the stressed layer cannot easily be deposited between FETs 151 and 152.

In order to favor the deposition of the stressed layer, a further dry etching process 182 is required, which is shown in FIG. 1e. Dry etching 182 is performed on the surface of the integrated circuit 100 after performing the silicidation process 181 and is preferably selective to oxide liner layer 167. FIG. 1e shows the integrated circuit 100 after dry etching 182 has been carried out. Etching 182 causes the width of spacer-1 structures 171sp1-174sp1 to shrink. In particular, the purpose of etching 182 is decreasing the thickness of spacer-1 structures 171sp1 and 172sp1, thereby increasing the aspect ratio of the gap between FETs 151 and 152. In this manner, the stressed layer may be more effectively deposited on the surface of the integrated circuit 100.

Etching 182 is normally performed without the presence of a mask and, consequently, affects the entire exposed surface of the integrated circuit 100, not only spacer structures 171-174. In particular, etching 182 removes a surface layer of metal silicide layers 151gs-154gs and 140-144. The thickness of the removed metal silicide layer ranges between approximately 2 nm and 5 nm. This results in a further increase of the contact resistance of metal silicide layers 151gs-154gs and 140-144.

Etching 182, although rendered necessary by the traditional manufacturing flow, is desirably omitted. Besides introducing a further step in the fabrication flow, etching 182 undesirably erodes metal silicide layers 151gs-154gs and 140-144. Furthermore, etching 182 is unduly performed on the entire surface of the integrated circuit 100, whereas the effect of spacer structure thinning is only required on FETs 151 and 152, which can be, for example, N-channel FETs. The reader is here reminded that the spacer structures of FETs 153 and 154, which may be P-channel FETs, have a satisfactory thickness also before performing etching 182.

The limitations and problems outlined above become more critical the more the distance between neighboring FETs decreases in an integrated circuit. This situation calls for an improved manufacturing flow, capable of compensating for the thickness imbalance between spacer structures of, for example, N-channel FETs and P-channel FETs.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is based on the inventive idea that the thickness imbalance between spacer structures of N-channel FETs and P-channel FETs in an integrated circuit may be reduced by performing a dedicated etching step in the presence of a mask covering the P-channel FETs. Based on this idea, a method of forming an integrated circuit is provided that includes forming at least a first FET comprising a first gate structure and a first spacer structure formed on the sidewall of the first gate structure, forming at least a second FET comprising a second gate structure and a second spacer structure formed on the sidewall of the second gate structure, a semiconductor alloy being embedded in the source/drain regions of the second FET, depositing a mask layer onto the integrated circuit so as to cover the second FET and leave the first FET exposed, and performing an etching process in the presence of the mask layer so as to decrease the thickness of the first spacer structure.

The spacer-reducing etching process only affects the first FETs, since the second FETs are protected from the action of the etching process under the mask layer. If the thickness of the spacer structures of the first FETs is initially greater than the thickness of the spacer structures of the second FETs, then the spacer-reducing etching is conveniently used in order to equalize the thicknesses of the spacer structures of the FETs in the integrated circuit. Conveniently, the first FET or plurality of FETs may be N-channel FETs, whereas the second FET or plurality of FETs may be P-channel FETs. The mask layer may conveniently be the mask used when implanting N-type doping ions in the source and drain regions of the N-channel FETs. In this case, the spacer-reducing etching may be performed directly after the N-type ion implantation. In this manner, the etching process is performed before the silicidation process resulting in formation of a metal silicide layer. Thus, the claimed method preserves the original thickness of the metal silicide layer, since no other further thinning etching process is required after the silicidation.

BRIEF DESCRIPTION OF THE DRAWINGS

The disclosure may be understood by reference to the following description taken in conjunction with the accompanying drawings, in which like reference numerals identify like elements, and in which.

Figure 1A:
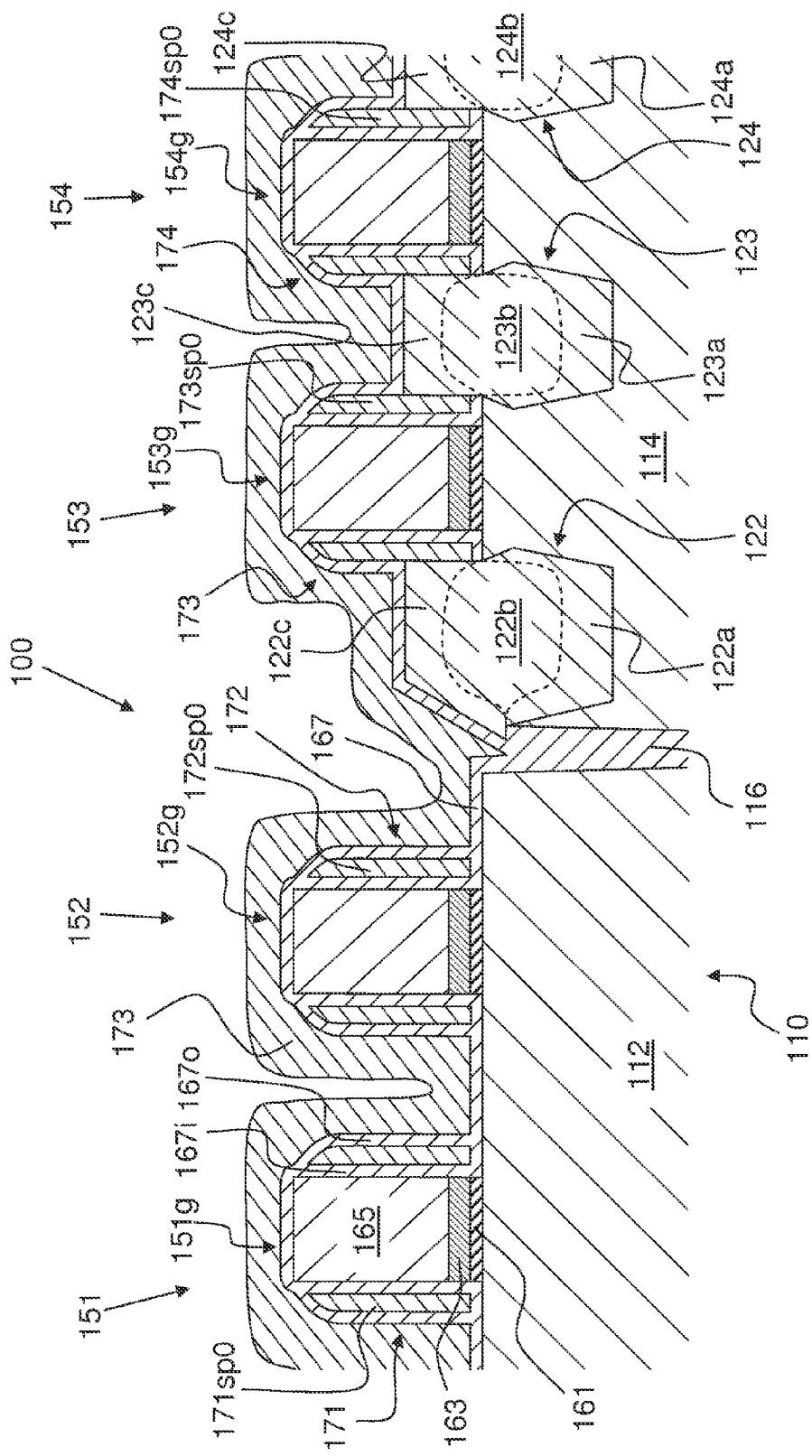
FIGS. 1a-1e schematically illustrate cross-sectional views of an integrated circuit comprising a plurality of transistors during subsequent stages of a fabrication process flow according to the prior art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

It should be noted that, where appropriate, the reference numbers used in describing the various elements illustrated in FIGS. 2a-2e substantially correspond to the reference numbers used in describing the corresponding elements illustrated in FIGS. 1a-1e above, except that the leading numeral for corresponding features has been changed from a "1" to a "2". For example, integrated circuit 100 corresponds to integrated circuit 200, FETs 151-154 correspond to FETs 251-254, respectively, semiconductor alloy layers 122-124 correspond to semiconductor alloy layer 222-224, respectively, and so on. Accordingly, the reference number designations used to identify some elements of the presently disclosed subject matter may be illustrated in the FIGS. 2a-2e but may not be specifically described in the following disclosure. In those instances, it should be understood that the numbered elements shown in FIGS. 2a-2e which are not described in detail below substantially correspond with their like-numbered counterparts illustrated in FIGS. 1a-1e, and described in the associated disclosure set forth above.

Furthermore, it should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal" and the like—should be construed in light of that term's normal and everyday meaning relative to the depiction of the components or elements in the referenced figures. For example, referring to the schematic cross-section of the integrated circuit 200 depicted in FIG. 2a, it should be understood that the gate structures 251g and 252g (253g and 254g) are formed "above" the active region 212 (214) and that semiconductor layer 210 is "below" or "under" insulation layer 261. Similarly, it should also be noted that the first liner layer 267i of spacer structures 271-274 is positioned "adjacent to" the sidewalls of the gate electrode material 265, whereas the first liner layer 267i may be positioned "on" the sidewalls of the gate electrode material 265 in those embodiments wherein no other layers or structures are interposed therebetween.

Further, while in the following with reference to FIGS. 2a to 2e an exemplary embodiment of the invention is described on the basis of an HKMG process, the skilled person understands that the present invention is related to a difference in aspect ratios in trenches existing between transistor pairs, so that the invention is equally applicable, for instance, to processes and semiconductor structures employing gate structures comprising SiON/polysilicon, or other related materials.

FIGS. 2a-2e show cross-sectional views of the same portion of an integrated circuit 200 and a method of fabrication thereof according to an embodiment of the invention.

Figure 1B:
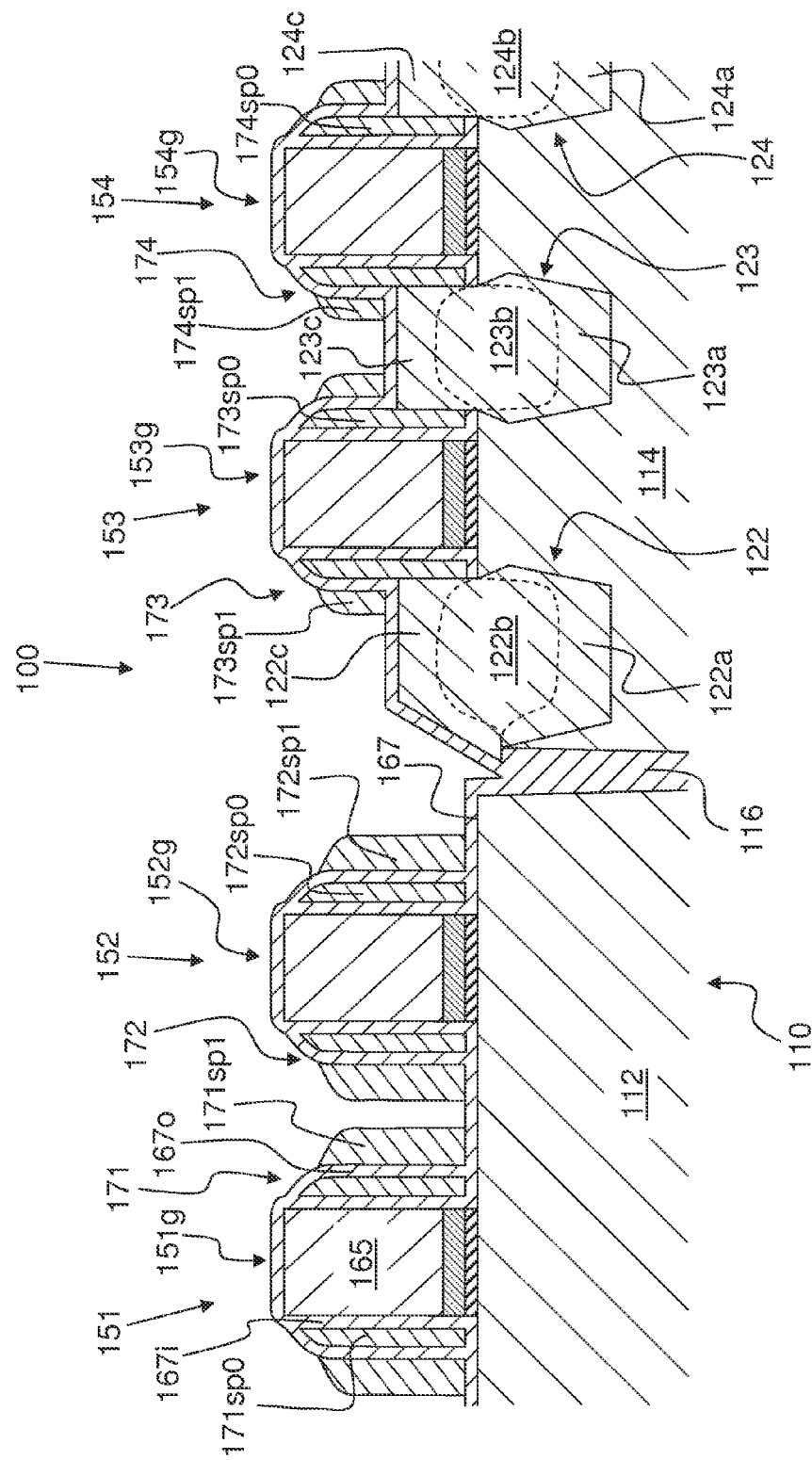
Figure 1C:
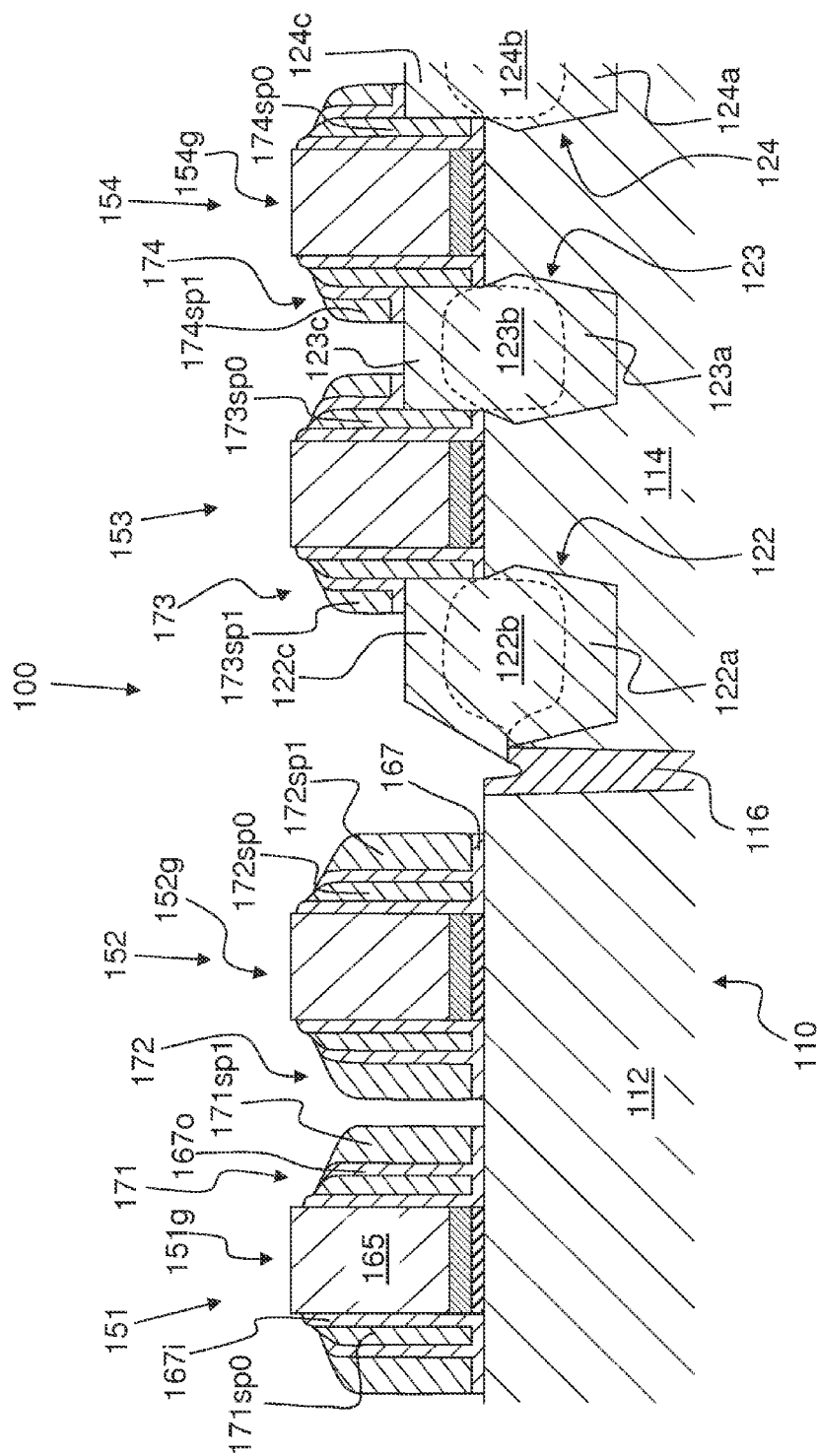
Figure 2A:
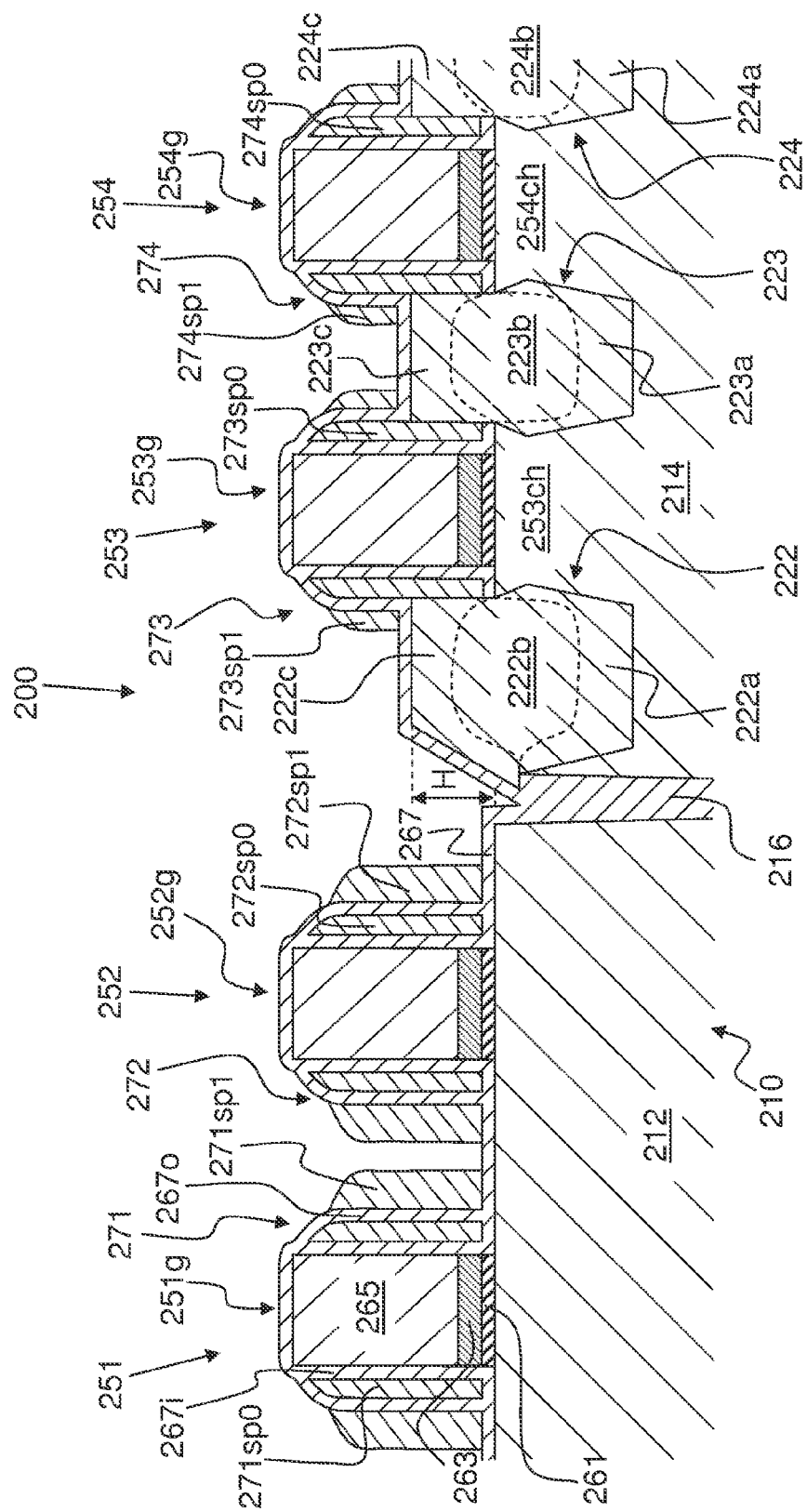
FIGS. 2a-2e schematically illustrate cross-sectional views of an integrated circuit comprising a plurality of transistors during subsequent manufacturing stages according to an embodiment of the method according to the present invention.

FIG. 2a shows a portion of the integrated circuit 200 during a fabrication stage substantially corresponding to that shown in FIG. 1b. The integrated circuit 200 is formed partly in and partly on top of a semiconductor layer 210. In some embodiments, the semiconductor layer 210 comprises silicon. In more specific embodiments, the semiconductor layer 210 comprises mono-crystalline silicon. In other embodiments, the semiconductor layer 210 may comprise other semiconductor materials such as Ge or a III-V semiconductor. The semiconductor layer is supported by a substrate (not shown), which can be any suitable carrier for an integrated circuit. The substrate and semiconductor layer 210 may form a siliconon-insulator (SOI) configuration. Alternatively, the semiconductor layer 210 may be formed in the bulk of the substrate.

The semiconductor layer 210 is divided into active regions, separated by isolation regions 216. The isolation regions 216 may comprise any electrically insulating material. In some embodiments, the isolation regions 216 comprise $SiO_2$. Isolation regions 216 may be formed by using a well-established technique such as, for example, STI.

FIG. 2a shows a first active region 212 and a second active region 214 separated by the isolation region 216. In and above the first active region 212, two FETs 251 and 252 have been partly formed. Analogously, in and above the second active region 214, two FETs 253 and 254 have been partly formed. In some embodiments, FETs 251 and 252 have the same polarity and the polarity of FETs 253 and 254 is opposite the polarity of FETs 251 and 252. In some embodiments, FETs 251 and 252 are N-channel FETs and FETs 253 and 254 are P-channel FETs. For example FETs 251-254 may form two pairs of opposite-polarity FETs used in the CMOS technology.

FETs 251-254 comprise a gate structure 251g-254g, respectively, formed on the surface of the semiconductor layer 210. Before forming gate structures 251g-254g, active regions 212 and 214 may undergo a series of ion implantations in order to form therein a desired doping profile. For example, an inverse-polarity doping may be performed in active regions 212 and 214. Thus, active region 212 may be lightly doped with P-type impurities and active region 214 with N-type impurities.

According to the embodiment shown in FIG. 2a, gate structures 251g-254g have been formed according to the HKMG technology. In a specific embodiment, gate structures 251g-254g have been manufactured according to the gate-first HKMG approach.

Thus, gate structures 251g-254g each comprise a gate insulating layer 261 formed directly on the surface of the semiconductor layer 210. The insulating layer 261 comprises a high-k material. By high-k material it is referred to a material with a dielectric constant "k" higher than 10. Examples of high-k materials used as insulating layers in gate electrodes are tantalum oxide ($Ta_2O_5$), strontium titanium oxide ($SrTiO_3$), hafnium oxide ($HfO_2$), hafnium silicon oxide (HfSiO), zirconium oxide ($ZrO_2$) and the like.

Gate structures 251g-254g further comprise a gate metal layer 263 formed on the gate insulating layer 261 in order to permit threshold-voltage adjustment. The gate metal layer 263 may comprise a metal such as tantalum or tungsten. The gate metal layer 263 may also comprise a nitride such as, for example, titanium nitride or tantalum nitride. A certain percentage of a work function metal species, such as aluminum, lanthanum and the like, may be included in the gate metal layer 263 in combination with other materials.

A gate material layer 265 is then formed in each of the gate structures 251g-254g onto the gate metal layer 263. Typically, the gate material layer 265 comprises a semiconductor. In some embodiments, the gate material layer 265 comprises poly-crystalline silicon (poly-Si).

In some embodiments, the width of the gate structures 251g-254g is less than 50 nm. In more specific embodiments, the width of the gate structures 251g-254g is 28 nm or less. The width of a gate structure is defined as the dimension of the gate material layer 265 along the horizontal direction in FIGS. 2a-2e.

Again with reference to FIG. 2a, semiconductor alloy layers 222-224 have been embedded in active region 214 in proximity to gate structures 253g and 254g. The semiconductor alloy layers 222-224 are formed as described above with reference to FIG. 1a.

With reference to FIG. 2a, trenches are formed in the active region 214 in adjacent positions to gate structures 253g and 254g. Trenches are formed next to the channel regions 253ch and 254ch of FETs 253 and 254, respectively. A series of ion implantations may then be carried out in order to form halo regions of channel regions 253ch, 254ch and extension regions (not shown) of source and drain regions (not shown) of transistors 253 and 254. The trenches thus formed are subsequently filled with a semiconductor alloy epitaxially grown on the trench walls by means of a well-established epitaxial deposition technique. The semiconductor alloy layers 222-224 thus formed will be included in the source and drain regions of FETs 253 and 254, after the manufacturing process is concluded. The semiconductor alloy layers 222-224 may be doped with impurities of a predetermined polarity. For example, if FETs 253 and 254 are PFETs, P-type doping ions may be included in the semiconductor alloy layers 222-224. Thus, boron (B) doping agents may be present in a predetermined concentration in the semiconductor alloy layers 222-224.

In some embodiments, the semiconductor alloy layers 222-224 comprise an SiGe alloy with a predetermined Ge concentration. In this manner, if the semiconductor layer 210 comprises silicon, epitaxially grown SiGe exerts a compressive strain on channel regions 253ch and 254ch, which is beneficial for P-channel FETs, as explained above.

In some embodiments, the concentration of Ge is variable in each SiGe layers 222-224 and depends on the position within each layer 222-224. In some embodiments, SiGe layers 222-224 are comprised of a bottom portion 222a-224a formed next to the sidewalls of the trenches in the active region 214, a middle portion 222b-224b formed on the bottom portions 222a-224a, and a top portion 222c-224c formed on the middle portions 222b-224b, respectively.

In some embodiments, bottom portions 222a-224a have a lower Ge concentration than middle portions 222b-224c. In some embodiments, the Ge concentration in bottom portions 222a-224a is approximately 25% (Si concentration 75%), whereas the Ge concentration in middle portions 222b-224b is approximately 35% (Si concentration 65%). The concentration gradient causes the internal stress of layers 222-224 to be concentrated in middle portions 222b-224c, thus alleviating the internal stress degree of bottom portions 222a-22b forming an interface with silicon layer 210. This favors a pseudomorphic growth of SiGe layers 222-224 on silicon layer 210, as described above with reference to FIG. 1a.

Again with reference to FIG. 2a, in some embodiments, top portions 222c-224c of SiGe layers 222-224, respectively, are exclusively comprised of silicon, with a null or negligible concentration of Ge. Top layers 222c-224c are advantageous when performing the silicidation process aimed at forming electrical contacts to the electrodes of FETs 251-254, since metal silicide is more easily formed in pure silicon than in an SiGe alloy with a Ge concentration significantly greater than 0.

Due to the structure of SiGe alloy layers 222-224, the trenches in active region 214 are significantly overfilled with embedded semiconductor alloy material. As described above with reference to FIG. 1a, the semiconductor alloy material of layers 222-224 protrudes from the surface of active region 214 by a height H which is significant with respect to the height of gate structures 253g and 254g. Height H can be as high as 20 nm. Here, by term "height" of a constituent element of integrated circuit 200, the dimension of that element along the vertical direction in FIGS. 2a-2e should be understood.

After forming gate structures 251g-254g and embedded semiconductor alloy layers 222-224, spacer structures 271-274 shown in FIG. 2a are formed. Spacer structures 271-274 are formed in the same manner as spacer structures 171-174 described above with reference to FIGS. 1a and 1b.

Thus, a liner layer 267 may be used as an etch-stop layer. The liner layer 267 may comprise an oxide, such as, for example, $SiO_2$. The liner layer 267 may comprise a first liner layer 267i and a second liner layer 267o. Initially, the first liner layer 267i may be deposited so as to be adjacent to the sidewalls of gate structures 251g-254g. In some embodiments, the first liner layer 267i forms an interface with the sidewalls of gate structures 251g-254g. Subsequently, a first dielectric layer is deposited onto the first liner layer 267i and patterned while using the first liner layer 267i as an etch-stop layer. Patterning the first dielectric layer results in formation of inner portions 271sp0-274sp0 of spacer structures 271-274. Inner portions 271sp0-274sp0 are also known as spacer-0 structures. In some embodiments, spacer-0 structures 271sp0-274sp0 comprise $Si_3N_4$.

After forming spacer-0 structures 271sp0-274sp0, a series of ion implantations may be performed on the integrated circuit 200. This series of implantations may be aimed at forming halo regions and extension regions (not shown) of source and drain regions of FETs 251 and 252. For example, if FETs 251 and 252 are N-channel FETs, N-type doping agents may be implanted in active region 212.

After forming spacer-0 structures 271sp0-274sp0 and, where needed, after performing the series of halo and extension implantations of FETs 251 and 252, the second liner layer 267o may be deposited, preferably comprising an oxide material, which may be the same material as the first liner layer 267i. The second liner layer 267o may have a thickness ranging between approximately 2 nm and 4 nm.

Subsequently, a conformal deposition may be carried out in order to form a second dielectric layer onto the second liner layer 267o. This second dielectric layer, analogous to layer 173 shown in FIG. 1a, may comprise $Si_3N_4$. The second dielectric layer is then patterned by using a dry etching in order to form outer portions 271sp1-274sp1 of spacer structures 271-274, as described above with reference to FIG. 1b. Outer portions 271sp1-274sp1 are also known as spacer-1 structures.

Again with reference to FIG. 2a, the dry etching used in the patterning step resulting in formation of spacer-1 structures 271sp1-274sp1 is usually highly anisotropic and is performed on the whole surface of the integrated circuit 200. Thus, patterning the second dielectric layer results in the thickness of spacer-1 structures 271sp1 and 272sp1 to be much greater than the thickness of spacer-1 structures 273sp1 and 274sp1. For example, when manufacturing semiconductor integrated circuits according to the 28-nm technology in the gate-first HKMG approach, the thickness of spacer-1 structures 271sp1 and 272sp1 of FETs 251 and 252 is in the range of approximately 12 nm to 14 nm.

The reason for which spacer-1 structures 273sp1 and 274sp1 are much thinner than spacer-1 structures 271sp1 and 272sp1 is the presence in the active region 214 of the semiconductor alloy material, e.g., SiGe, overfilling the trenches in which the semiconductor alloy layers 222-224 are hosted. This spacer thickness imbalance is particularly detrimental to the following manufacturing stages, as shown above with reference to FIGS. 1a-1e.

Again with reference to FIG. 2a, it should be noted that the process of forming spacer-1 structures 271sp1-274sp1 results in a gap between FETs 251 and 252 having a high aspect ratio.

Figure 2B:
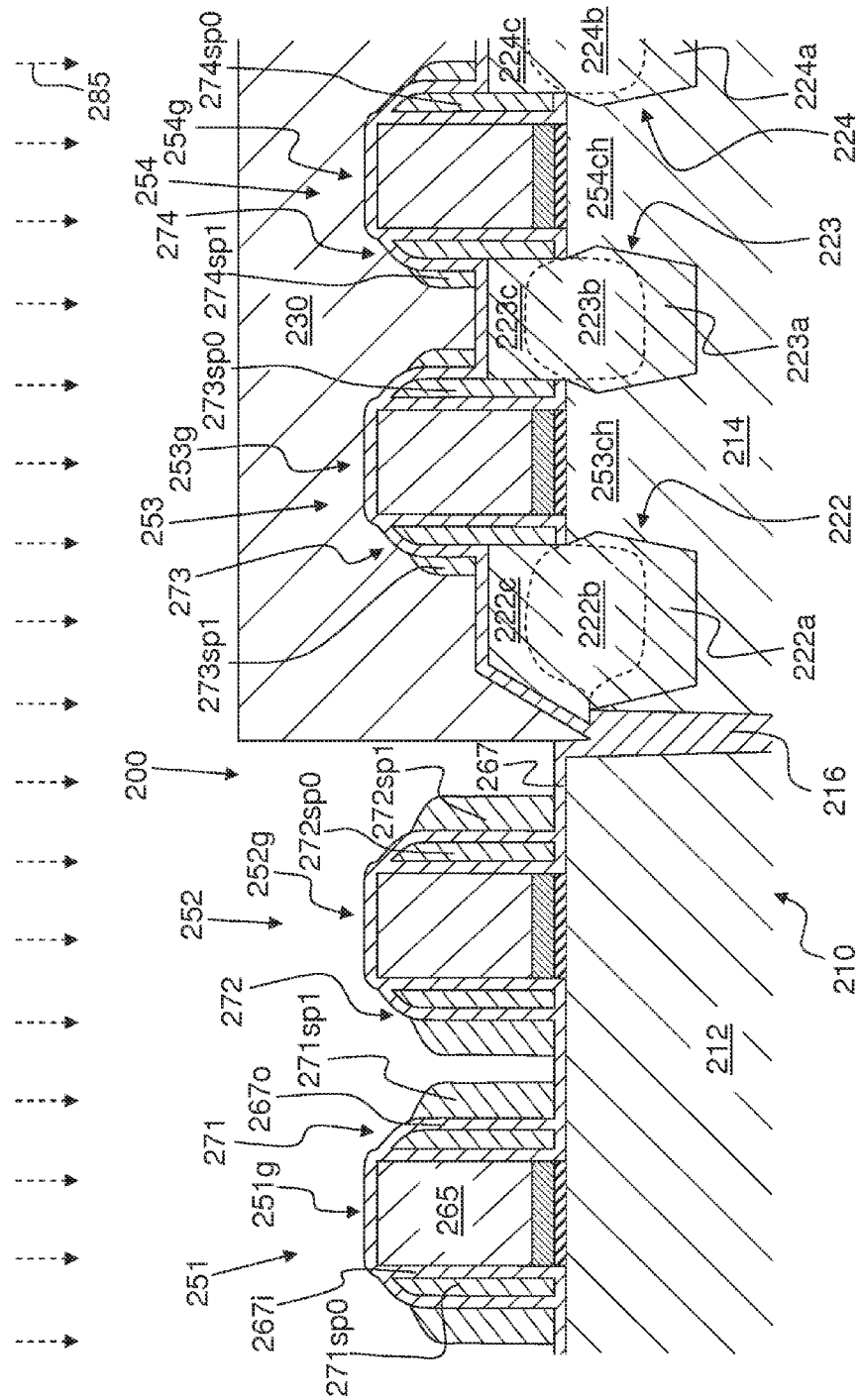

FIG. 2b shows a cross-sectional view of the integrated circuit 200 in a subsequent manufacturing stage to that shown in FIG. 2a. As shown in FIG. 2b, after forming spacer-1 structures 271sp1-274sp1, a mask layer 230 is deposited on predetermined portions of the surface of the integrated circuit 200. More specifically, the mask layer 230 is formed so as to cover FETs 253 and 254 and to leave exposed FETs 251 and 252. In general, the mask layer 230 covers those FETs whose source and drain regions included an embedded semiconductor alloy and leave those FETs exposed whose source and drain region do not comprise any embedded semiconductor alloy layers. In some embodiments, the mask layer 230 covers PFETs and leaves NFETs exposed.

In some embodiments, the mask layer 230 comprises a photoresist. In this case, the mask layer 230 may be conveniently formed by means of a standard lithographic technique. For example, a continuous photoresist layer may be applied to the surface of the integrated circuit 200 by using, for example, spin-coating or a similar film formation technique. Subsequently, the photoresist layer may be irradiated with light of a predetermined wavelength, for example UV light, through an appropriately patterned mask interposed between the light source and integrated circuit 200. The photoresist layer may be subsequently developed in order to reproduce therein the pattern in the mask.

Alternatively, the mask layer 230 may comprise a hard mask, comprised, for example, of a dielectric material. In this case, the mask layer 230 may be formed by depositing a continuous layer of a dielectric material, for example an oxide or a nitride, on the surface of the integrated circuit 200. A photoresist film can then be applied on the surface of the dielectric layer. A pattern can thereafter be formed in the photoresist film, for example by using well-established photolithographic techniques as described above. Thereafter, the pattern may be transferred from the photoresist film to the dielectric layer. This may, for example, be achieved by using a wet etching or a dry etching technique. According to this embodiment, the photoresist may be removed after the pattern is transferred onto the dielectric layer making up the mask layer 230.

After forming the patterned mask layer 230, a further series of ion implantations 285 are performed in the presence of the mask layer 230. Ion implantations 285 are mainly carried out in order to form deep regions of source and drain regions of FETs 251 and 252. For example, N-type doping agents may be implanted in active region 212 by means of implantations 285. It should be noted that FETs 253 and 254 formed in the active region 214 are not affected by implantations 285, since they are covered by the mask layer 230. This is a desirable effect, since FETs 253 and 254 have an opposite polarity with respect to FETs 251 and 252.

The present disclosure proposed to perform an additional etching process in order to alleviate the spacer thickness imbalance between FETs 251 and 252 without embedded SiGe and FETs 253 and 254 with embedded SiGe in the source/drain regions. This etching process is performed directly after ion implantations 285 and before the silicidation module, as will be described more extensively in the following.

Figure 2C:
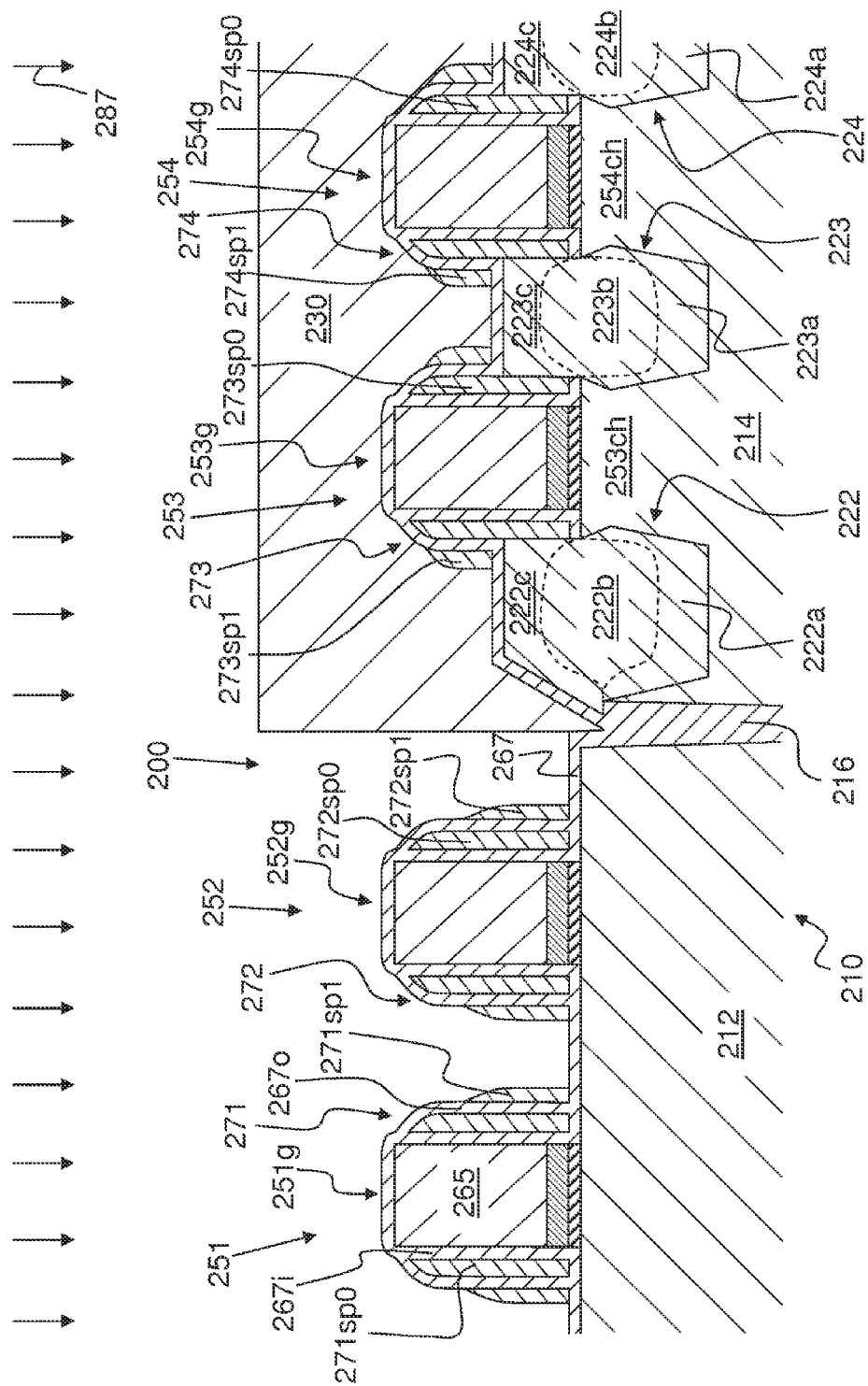

FIG. 2c shows a cross-sectional view of the integrated circuit 200 in a subsequent manufacturing stage to that shown in FIG. 2b. After forming the mask layer 230 and performing ion implantations 285, the proposed manufacturing flow introduces a dry etching process 287 aimed at reducing the thickness of spacer-1 structures 271sp1 and 272sp1. Dry etching 287 may comprise a highly selective etching process such as to etch a nitride such as $Si_3N_4$ at a much greater rate than an oxide such as $SiO_2$ or a general silicon oxide. In this manner, dry etching 287 etches spacer-1 structures 271sp1 and 272sp1 at a much greater rate than underlying second liner layer 267o. In some embodiments, dry etching 287 may be performed based on a gaseous mixture of one or more of $CH_3F$, $CH_2F_2$, $O_2$, $CHF_3$, He, Ar, $N_2$, or in general $C_xH_yF_z$, preferably in combination with an inert gas.

In some embodiments, dry etching 287 is anisotropic. For example, dry etching 287 may comprise plasma etching or reactive-ion-etching (RIE).

In some embodiments, spacer-reducing etching process 287 is performed in the presence of the mask layer 230 used during ion implantations 285. According to these embodiments, FETs 253 and 254 are not affected by spacer-reducing etching process 287, since they are covered by the mask layer 230. In some embodiments, no other manufacturing step is performed between ion implantations 285 and spacer-reducing etching process 287.

FIG. 2c shows the integrated circuit 200 after spacer-reducing etching process 287 has been performed. The thickness of spacer-1 structures 271sp1 and 272sp1 has considerably decreased due to the application of etching 287. The parameters of etching 287 may be adjusted in order to obtain a predetermined thickness of spacer-1 structures 271sp1 and 272sp1. In some embodiments, the spacer-reducing etching process 287 removes a layer with a thickness of approximately 5 nm from each of spacer-1 structures 271sp1 and 272sp1. In this manner, the gap between FETs 251 and 252 is increased by approximately 10 nm due to the spacer-reducing etching process 287. For example, in the 28-nm technology, the thickness of spacer-1 structures 271sp1 and 272sp1 may be in the range of approximately 6 nm to 8 nm after performing the spacer-reducing etching 287.

In general, the spacer-reducing etching process 287 may be adjusted so that the thickness of spacer-1 structures 271sp1 and 272sp1 is approximately equal to the thickness of spacer-1 structures 273sp1 and 274sp1. Thus, the spacer-reducing etching process 287 can reduce or, in extreme cases, eliminate the imbalance of spacer thickness between FETs 251 and 252, having no embedded semiconductor alloy layer, and FETs 253 and 254, having embedded semiconductor alloy layers 222-224 in the respective source and drain regions.

Due to the spacer-reducing etching process 287, the mask layer 230 may be formed of a slightly greater thickness than in the traditional manufacturing in order to account for the erosion caused by etching 287.

Analogously, the second liner layer 267o may also be formed of a greater thickness than in the conventional manufacturing flow. For example, the second liner layer 267o may have a thickness greater by about 10 Å than the thickness of the second liner layer 167o shown in FIGS. 1a-1e and used in the conventional manufacturing flow. For example, the second liner layer 267o may have a thickness in the range of about 3-4 nm. Although the etching process 287 is preferably highly selective to the oxide constituting the second liner layer 267o, a certain degree of erosion of this layer may still occur. Thus, by increasing the thickness of the second liner layer 267o, this limited erosion effect can be taken into account.

Furthermore, the thickness of the second dielectric layer resulting in spacer-1 structures 271sp1-274sp1 may be decreased by about 10 Å with respect to the conventional flow. Thus, the thickness of the second dielectric layer may be in the range of about 12-13 nm.

Figure 2D:
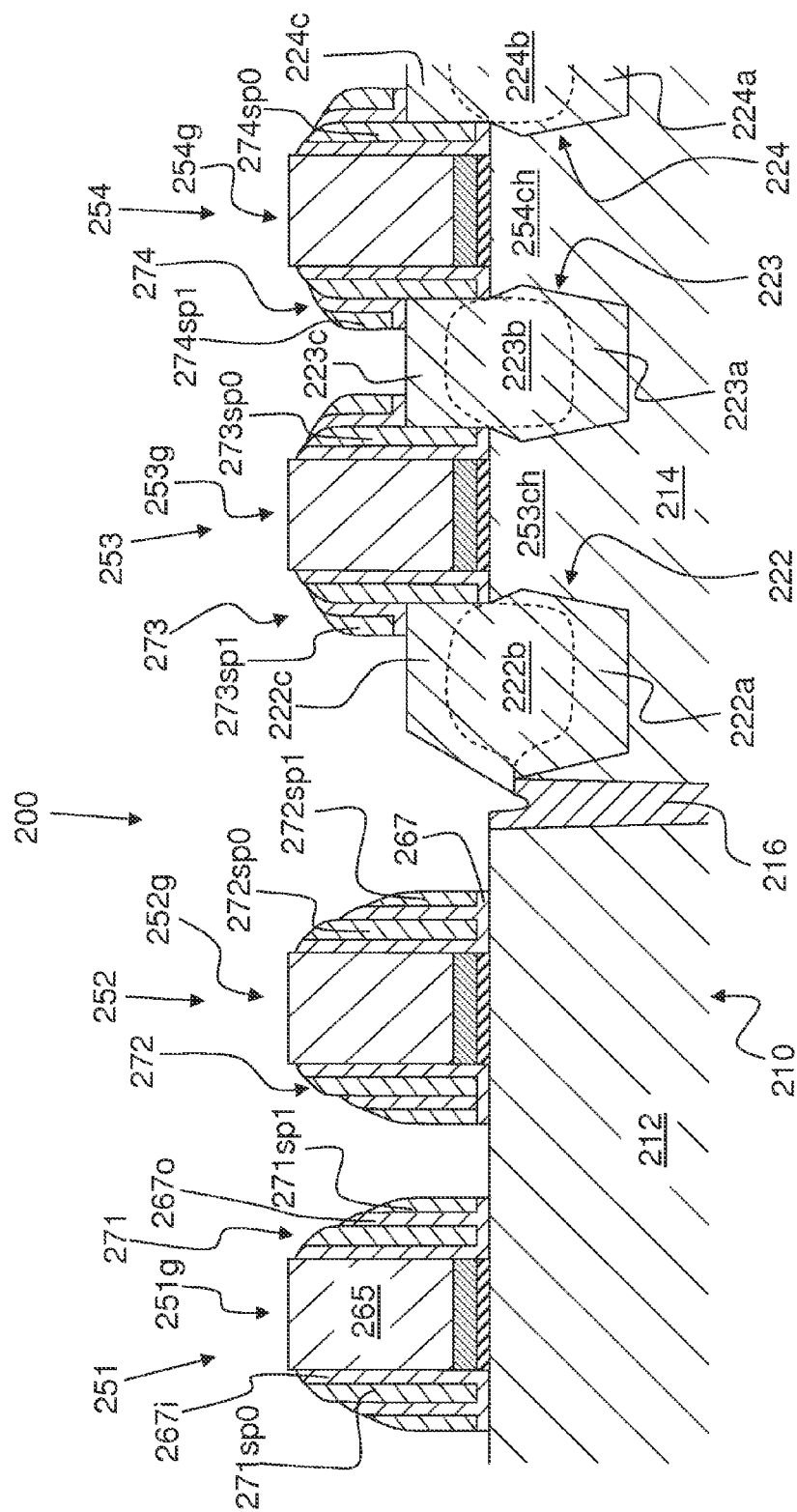

After performing the spacer-reducing etching 287, the manufacturing flow continues as shown in FIG. 2d, schematically depicting the integrated circuit 200 in a subsequent manufacturing stage to that shown in FIG. 2c. After performing the spacer-reducing etching 287, the mask layer 230 is removed. The mask layer 230 may be removed by means of a plasma-based dry etching process. The process of removing the mask layer 230 may conveniently comprise an improved crust break-through step.

After removing the mask layer 230, an annealing step is performed in order to activate the implanted ions and to let the semiconductor layer 210 recover from implantation damage.

Subsequently, after removing the mask layer 230 and performing the annealing cycle, the exposed portion of the liner layer 267 is removed, thus leaving exposed surface portions of the semiconductor layer 210 and of the gate material layer 265 of gate structures 251g-254g. This may be achieved by means of a wet etching process. The wet etching process may be based on a diluted solution of hydrofluoric acid (HF). It should be noted that, after removing the exposed portion of oxide liner 267, the aspect ratio of the gap between FETs 251 and 252 is much less than that of the gap between FETs 151 and 152 shown in FIG. 1c and resulting from the conventional manufacturing flow described above. Consequently, the surface portion of the active region 212 exposed between FETs 251 and 252 after the process of removing the oxide liner 267 is much larger than in the conventional manufacturing flow.

Figure 2E:
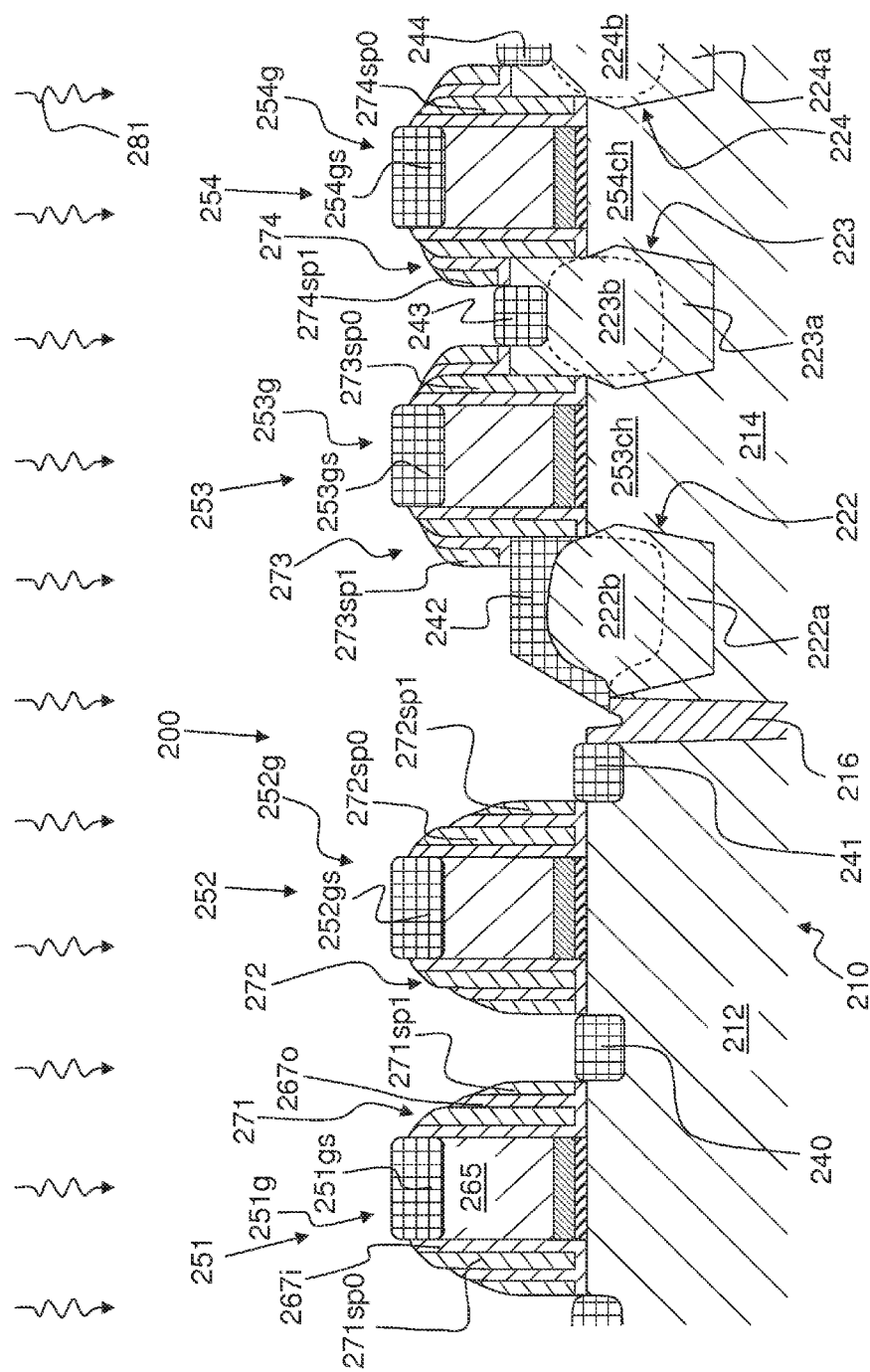

FIG. 2e shows a cross-sectional view of the integrated circuit 200 in a subsequent manufacturing stage to that shown in FIG. 2d. After removing the exposed portions of the oxide liner layer 267, a silicidation process 281 is performed in order to form a metal silicide layer partly in and partly on the exposed surface areas of the semiconductor layer 210 and of the gate material layer 265 of the gate structures 251g-254g.

The silicidation process 281 occurs in a standard manner. For example, the silicidation process 281 may start by depositing a metal layer on the surface of the integrated circuit 200. The metal layer may conveniently comprise nickel. Alternatively, the metal layer may comprise titanium or cobalt. Some other metals, such as platinum, may also be present in order to favor metal silicide formation.

After depositing the metal layer, a heat treatment can be applied to the integrated circuit 200. The heat treatment may be performed at a temperature in the range of about 300-500° C. for a time period ranging approximately from 10 seconds to a few minutes.

For example, the heat treatment may be a two-step process. A first heat treatment step may be performed in the range of approximately 250-400° C. for a time period of approximately 10-90 seconds. After the first heat treatment step, any non-reacted metal may be selectively removed by one of a variety of well-known etching/cleaning processes. Finally, a second heat treatment step may be performed in the range of approximately 400-500° C., again for a time period of approximately 10-90 seconds.

FIG. 2e shows the integrated circuit 200 after the heat treatment included in the silicidation process has been accomplished. The heat treatment initiates a chemical reaction between the metal atoms of the deposited metal layer and the semiconductor atoms included in those surface portions of the integrated circuit 200 which form an interface with the deposited metal layer. It should be noted that the silicon atoms in spacer structures 271-274 and in isolation region 216 do not take part in the silicidation reaction, in that they are included in those regions in the relatively stable forms of $Si_3N_4$ or $SiO_2$.

This chemical reaction results in the formation of metal silicide layers 251gs-254gs, formed partly in and partly on top of the gate material 265 of the gate structures 251g-254g, so as to provide an electrical contact to the gate electrode of FETs 251-254, respectively. Furthermore, metal silicide layers 240 and 241 have formed partly in and partly on top of the first active region 212, so as to provide electrical contacts with a low contact resistance to the source and drain regions of transistors 251 and 252. Analogously, metal silicide layers 242-244 have formed partly in and partly on top of portions 222c-224c of semiconductor alloy layers 222-224 embedded in the source and drain regions of FETs 253 and 254. Metal silicide layers 242-244 are more effectively formed, since top portions 222c-224c are mainly comprised of silicon, with a negligible percentage of Ge. Typically, metal silicide layers 251gs-254gs and 240-244 comprise nickel silicide (NiSi).

Figure 1D:
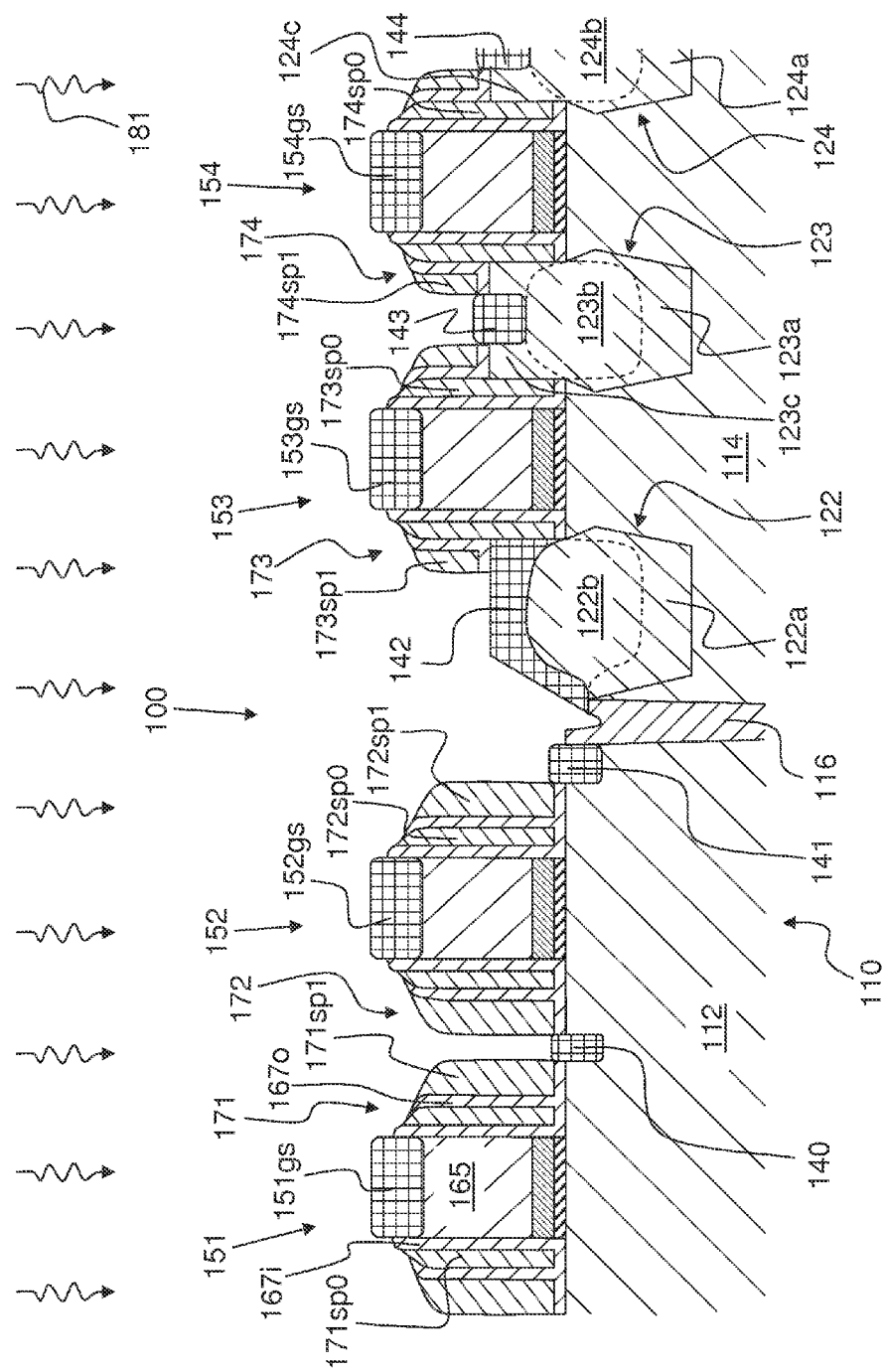
Figure 1E:
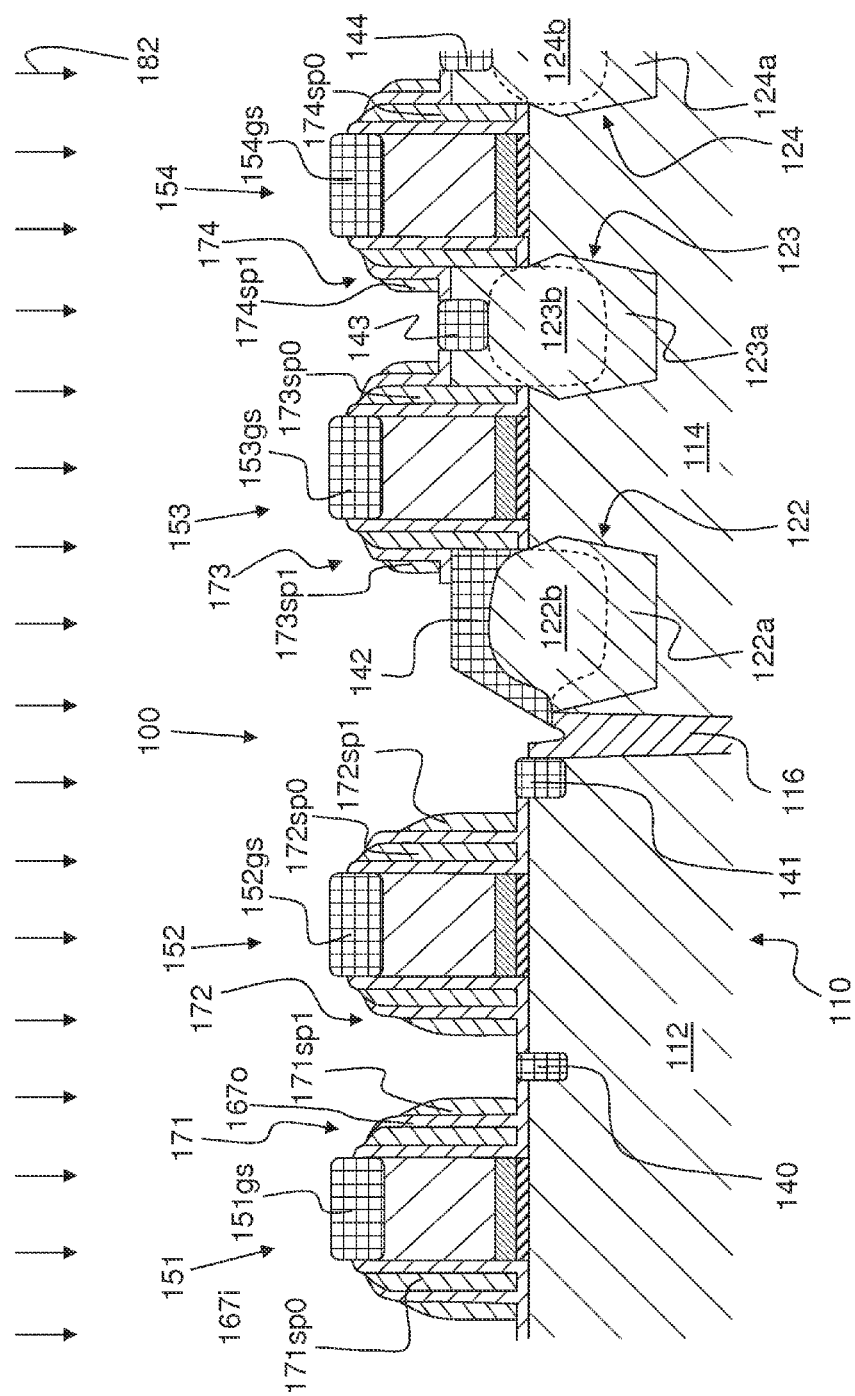

It should be noted that, due to the spacer-reducing etching 287 performed before silicidation 281, the metal silicide layer 240 between FETs 251 and 252 has a width (dimension along the horizontal direction in the figures) much greater than the analogous metal silicide layer 140 shown in FIG. 1d and resulting from the conventional process flow. In particular, again with reference to FIG. 2e, the width of the metal silicide layer 240 is comparable to the width of the metal silicide layer 243 formed between FETs 253 and 254. In this manner, the contact resistance to the source and drain regions of FETs 251 and 252 decreases considerably with respect to the traditional manufacturing flow. Consequently, the contact resistance to the source/drain regions of FETs 251 and 252, which may be N-channel FETs, is comparable or almost equal to the contact resistance to the source/drain regions of FETs 253 and 254, which may be P-channel FETs and have a semiconductor alloy such as SiGe embedded in their source and drain regions.

Furthermore, since the aspect ratio of the gap has been previously decreased by means of the spacer-reducing etching process 287, no additional etching step aimed at reducing the thickness of spacer-1 structures 271sp1 and 272sp2 is required after silicidation process 281. According to the present invention, an internally stressed layer (not shown) may be deposited on the surface of the integrated circuit 200 directly after performing silicidation 281, without any additional process steps therebetween. This internally stressed layer may comprise a stressed nitride, such as, for example, stressed $Si_3N_4$. In this manner, metal silicide layers 251gs-254gs and 240-244 are not eroded by any post-silicidation etching processes, in contrast to the conventional method which require a post-silicidation etching process 182 before depositing the internally stressed nitride layer.

Thus, the method according to the hereby proposed disclosure allows for a decrease of asymmetry in spacer thickness of FETs with and without an embedded semiconductor alloy in the FET source/drain regions. Asymmetry in spacer thickness usually occurs when N-channel FETs and P-channel FETs with an overfilling embedded semiconductor alloy are present in the same integrated semiconductor device. This situation is typical when manufacturing semiconductor devices according to the CMOS integration technology.

The effect of reducing the asymmetry in spacer thickness is achieved by means of a dedicated spacer-reducing dry etching process, which may be an anisotropic dry etching, adjusted so as to affect a nitride such as $Si_3N_4$ and to be highly selective to the oxide, e.g., $SiO_2$, constituting the liner layer underlying the exposed nitride layer. The spacer-reducing etching process is performed after forming the outer spacer-1 portion of the spacer structures and after performing a series of implantations aimed at forming deep regions of the source and drain regions of those FETs not including any overfilling embedded semiconductor alloy, e.g., the N-channel FETs.

The spacer-reducing etching process is preferably performed in the presence of a mask layer, which can be the same mask layer as used when performing the deep ion implantations onto the N-channel FETs. In this manner, the spacer-reducing etching process only affects the N-channel FETs, which are usually affected by the problem of an excessive spacer-1 thickness, and leaves P-channel FETs covered by the mask layer unaffected. The thickness of P-channel FETs, in case of presence of an overfilling embedded semiconductor alloy in their source and drain regions, does not have to be reduced, as shown above. It should be observed that no extra mask layer is to be formed when performing the spacer-reducing etching process.

The spacer-reducing etching process, carried out before performing the silicidation routine, results in the gap between neighboring N-channel FETs to be widened, thereby decreasing its aspect ratio. Thus, the spacer-reducing etching process permits formation of a wider metal silicide layer between neighboring N-channel FETs as compared to the standard manufacturing flow, thereby resulting in a reduced contact resistance to the source and drain regions of the N-channel FETs.

Reducing the aspect ratio of the gap between neighboring N-channel FETs makes it also possible to easily deposit an internally stressed layer on the surface of the integrated circuit after the silicidation process. Thus, the spacer-reducing etching process renders unnecessary the spacer-reducing etching module performed after silicidation in the course of the traditional manufacturing flow. In this manner, the metal silicide layer resulting from the silicidation process is not damaged by any dry etching performed after the silicidation, thus permitting a further decrease of the contact resistance to the source/drain electrodes of the FETs with respect to the conventional manufacturing flow.

The claimed method may be applied to all manufacturing technologies starting from 45 nm and beyond and, in particular, to the 28-nm technology and beyond. The claimed method may be conveniently applied in conjunction with the HKMG technology and, in particular, with the gate-first HKMG approach. The present invention, however, also is suitable for a gate stack composition using SiON and polysilicon.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A method of forming an integrated circuit, comprising:
    forming at least a first FET comprising a first gate structure and a first spacer structure formed on the sidewall of said first gate structure;
    forming at least a second FET comprising a second gate structure and a second spacer structure formed on the sidewall of said second gate structure, a semiconductor alloy being embedded in the source and/or drain regions of said second FET;
forming a mask layer on said integrated circuit so as to cover said second FET and leave said first FET exposed;
performing an ion implantation in the presence of said mask layer; and
after performing said ion implantation, performing an etching process in the presence of said mask layer so as to decrease the thickness of said first spacer structure.

2. The method of claim 1, wherein said first FET and said second FET have opposite polarities.

3. The method of claim 1, wherein said first FET is an N-channel FET and said second FET is a P-channel FET.

4. The method of claim 1, wherein said mask layer comprises a photoresist.

5. The method of claim 1, further comprising removing said mask layer after performing said etching process.

6. The method of claim 1, wherein said integrated circuit is formed partly in and partly on a semiconductor layer.

7. The method of claim 1, wherein said embedded semiconductor alloy comprises a portion extending above the surface of said semiconductor layer.

8. The method of claim 1, wherein said portion of said embedded semiconductor alloy protrudes by 10 nm or more from said surface of said semiconductor layer.

9. The method of claim 1, wherein said embedded semiconductor alloy comprises SiGe.

10. The method of claim 1, wherein a concentration of Ge varies within said embedded semiconductor alloy.

11. The method of claim 1, wherein said etching process comprises a dry etching process.

12. The method of claim 1, wherein said etching process does not affect said second FET.

13. The method of claim 1, further comprising:
forming an inner portion of said first spacer structure and an inner portion of said second spacer structure next to said first gate structure and said second gate structure, respectively; and
forming an outer portion of said first spacer structure and an outer portion of said second spacer structure above said inner portion of said first spacer structure and said inner portion of said second spacer structure, respectively.

14. The method of claim 13, wherein said mask layer is formed after forming said outer portion of said first spacer structure and said outer portion of said second spacer structure.

15. The method of claim 13, further comprising performing at least one ion implantation after forming said inner portions of said first spacer structure and said second spacer structure and before forming said outer portions of said first spacer structure and said second spacer structure.

16. The method of claim 1, wherein said first gate structure and said second gate structure are formed according to the HKMG technology.

17. The method of claim 1, wherein at least one of said first gate structure and said second gate structure comprises SiON and polysilicon.

18. A method of forming an integrated circuit, comprising:
forming at least a first FET comprising a first gate structure and a first spacer structure formed on the sidewall of said first gate structure;
forming at least a second FET comprising a second gate structure and a second spacer structure formed on the sidewall of said second gate structure, a semiconductor alloy being embedded in the source and/or drain regions of said second FET;
forming a mask layer on said integrated circuit so as to cover said second FET and leave said first FET exposed;
performing an etching process in the presence of said mask layer so as to decrease the thickness of said first spacer structure;
removing said mask layer after performing said etching process; and
performing a silicidation process after removing said mask layer so as to form a metal silicide layer on predetermined surface portions of said integrated circuit.

19. The method of claim 18, further comprising:
forming an inner portion of said first spacer structure and an inner portion of said second spacer structure next to said first gate structure and said second gate structure, respectively; and
forming an outer portion of said first spacer structure and an outer portion of said second spacer structure above said inner portion of said first spacer structure and said inner portion of said second spacer structure, respectively.

20. The method of claim 19, further comprising performing at least one ion implantation after forming said inner portions of said first spacer structure and said second spacer structure and before forming said outer portions of said first spacer structure and said second spacer structure.

21. A method of forming an integrated circuit, comprising:
forming at least a first FET comprising a first gate structure and a first spacer structure formed on the sidewall of said first gate structure;
forming at least a second FET comprising a second gate structure and a second spacer structure formed on the sidewall of said second gate structure, a semiconductor alloy being embedded in the source and/or drain regions of said second FET;
forming a mask layer on said integrated circuit so as to cover said second FET and leave said first FET exposed;
performing an ion implantation in the presence of said mask layer;
after performing said ion implantation, performing an etching process in the presence of said mask layer so as to decrease the thickness of said first spacer structure;
removing said mask layer after performing said etching process; and
performing a silicidation process after removing said mask layer so as to form a metal silicide layer on predetermined surface portions of said integrated circuit.

* * * * *